US007626262B2

(12) United States Patent
Otremba et al.

(10) Patent No.: US 7,626,262 B2
(45) Date of Patent: *Dec. 1, 2009

(54) ELECTRICALLY CONDUCTIVE CONNECTION, ELECTRONIC COMPONENT AND METHOD FOR THEIR PRODUCTION

(75) Inventors: Ralf Otremba, Kaufbeuren (DE); Xaver Schloegel, Sachsenskam (DE); Josef Hoeglauer, Munich (DE); Matthias Stecher, Munich (DE)

(73) Assignee: Infineon Technologies AG (DE)

( * ) Notice: Subject to any disclaimer, the term of this patent is extended or adjusted under 35 U.S.C. 154(b) by 126 days.

This patent is subject to a terminal disclaimer.

(21) Appl. No.: 11/424,150

(22) Filed: Jun. 14, 2006

(65) Prior Publication Data

US 2007/0290337 A1      Dec. 20, 2007

(51) Int. Cl.
*H01L 23/48* (2006.01)
(52) U.S. Cl. .................. 257/737; 257/781; 257/783; 257/E21.499; 438/106; 438/612; 438/614
(58) Field of Classification Search ......... 257/781–783, 257/773, E21.499; 438/106, 612–615
See application file for complete search history.

(56) References Cited

U.S. PATENT DOCUMENTS

| | | | |
|---|---|---|---|
| 4,685,210 A * | 8/1987 | King et al. ........... 29/830 |
| 5,260,234 A | 11/1993 | Long | |
| 5,784,779 A * | 7/1998 | Gruenwald et al. ......... 29/840 |
| 6,133,634 A | 10/2000 | Joshi .................... 257/738 |
| 6,582,990 B2 | 6/2003 | Standing ................. 438/106 |
| 6,624,522 B2 | 9/2003 | Standing et al. .......... 257/782 |
| 6,677,669 B2 | 1/2004 | Standing ................. 257/685 |
| 6,767,820 B2 | 7/2004 | Standing et al. .......... 438/614 |
| 6,774,497 B1* | 8/2004 | Qi et al. .................. 257/783 |
| 6,890,845 B2 | 5/2005 | Standing et al. .......... 438/614 |
| 7,271,470 B1* | 9/2007 | Otremba .................. 257/666 |
| 2004/0235287 A1* | 11/2004 | Inoue et al. ............... 438/612 |
| 2007/0200250 A1 | 8/2007 | Koenigsberger et al. | |

FOREIGN PATENT DOCUMENTS

| | | |
|---|---|---|
| DE | 4020048 | 2/1992 |
| DE | 19518659 | 11/1996 |
| DE | 102004041088 | 3/2006 |

* cited by examiner

*Primary Examiner*—Thinh T Nguyen
(74) *Attorney, Agent, or Firm*—Banner & Witcoff, Ltd.

(57) ABSTRACT

A connection structure includes a semiconductor die having a first major surface and an electrically conductive substrate having a second major surface. At least part of the second major surface is positioned facing towards and spaced at a distance from the first major surface. A galvanically deposited metallic layer extends between the first major surface and the second major surface and electrically connects the first major surface and the second major surface.

12 Claims, 2 Drawing Sheets

ELECTRICALLY CONDUCTIVE CONNECTION, ELECTRONIC COMPONENT AND METHOD FOR THEIR PRODUCTION

TECHNICAL FIELD

The application relates to an electrically conductive connection, in particular to an electrically conductive connection between a semiconductor die and an electrically conductive surface and to an electronic component which comprises at least one of these electrically conductive connections and to methods of producing the connection structure and the electronic component.

BACKGROUND

Semiconductor dies are typically provided in a package which includes a rewiring structure. The rewiring structure provides electrical connections between the contact pads of the semiconductor die, and consequently the device structures of the semiconductor die, and the external contact surfaces of the semiconductor package. The external contact surfaces enable the package to be mounted on a higher level circuit board such as a printed circuit board.

Depending on the type of semiconductor die and the rewiring structure, the electrical connections between the semiconductor die and the rewiring structure within the package may be provided in number of different ways, for example by bond wires, solder balls or leadfingers. The functionality of the package may be affected by the electrical connections of the rewiring structure. The electrical connections may introduce a high impedance and/or cross-talk or cause even short circuits due to movement of the electrical connection, for example bond wire sag during a molding process, which affects the performance of the package. Additionally, poor joint connections between the electrical connection and the contact pads may have a high electrical resistance which may cause overheating and failure of the package.

It is, therefore, desirable to further improve the reliability of the electrical connections within the package so as to improve the reliability and performance of the package.

SUMMARY

A connection structure may comprise a semiconductor die and an electrically conductive surface. The semiconductor die may comprise a first major surface and the electrically conductive substrate may comprise a second major surface. At least part of the second major surface can be positioned facing towards and spaced at a distance from the first major surface to provide a gap. A galvanically deposited metallic layer may extend between the first major surface and the second major surface and electrically connects the first major surface and the second major surface.

A method of producing a connection structure may comprise providing a semiconductor die comprising a first major surface and providing a first electrically conductive substrate comprising a second major surface. At least part of the second major surface can be positioned facing towards the first major surface and the second major surface can be spaced at a distance from the first major surface to provide a gap. A metallic layer can be galvanically deposited at least on the second major surface. The galvanic deposition can be continued until the metallic layer extends between the first major surface and the second major surface and the galvanically deposited metallic layer electrically connects the first major surface and the second major surface.

DETAILED DESCRIPTION

A connection structure comprises a semiconductor die and an electrically conductive surface. The semiconductor die comprises a first major surface and the electrically conductive substrate comprises a second major surface. At least part of the second major surface is positioned facing towards and spaced at a distance from the first major surface to provide a gap. A galvanically deposited metallic layer extends between the first major surface and the second major surface and electrically connects the first major surface and the second major surface.

The first major surface and the second major surface are physically, as well as electrically connected, by a galvanically deposited metallic layer which extends directly between them. The galvanically deposited metallic layer is electrically conductive.

A galvanically deposited metallic layer may be structurally distinguished by a characteristic microstructure, from which the growth mechanism and direction may be identified, as well as by its texture and crystallographic perfection. A galvanically deposited metallic layer can, therefore, be distinguished from a metallic layer is formed by other deposition techniques, such as sputtering or thermal evaporation, and from metallic layers provided by a metallic sheet, which is typically formed by rolling and distinguished by a characteristic microstructure and rolling texture. A galvanically deposited layer can also be distinguished structurally from a metallic layer formed from a soft solder or diffusion solder. The galvanically deposited layer may be tin-free and free from soft solder and diffusion solder. The connection structure may also be tin-free and free from soft solder and diffusion solder.

At least a region of the galvanically deposited metallic layer is positioned in the gap between the first major surface and the second major surface and extends directly from the first major surface to the second major surface. The interface between the galvanically deposited metallic layer and each of the first and second major surfaces is free of further adhesives, solder based materials including soft solder as well as the intermetallic phases formed during a diffusion solder process. The structure of this interface also enables the galvanically deposited metallic layer to be distinguished from other electrically conductive connection structures, such as for example a diffusion solder bond, which may also be deposited by galvanic deposition but which is afterwards subjected to a further heat treatment to create the bond. The interfaces between the galvanically deposited metallic layer of the application are free from intermetallic phases caused by a reaction between the metallic layer and the material of the adjoining surfaces.

The galvanically deposited metallic layer may comprise a metal or an alloy and may consist essentially of copper, nickel, a copper based alloy, and a nickel based alloy such as nickel with 1 wt % phosphorous or nickel with 1 wt % vanadium.

The first major surface and the second major surface may be arranged approximately parallel to one another. This creates a gap between them which has approximately the same height over the majority of the overlapping region. This simplifies the production of the connection structure since the thickness of the galvanically deposited layer which may be required to physically join them is approximately uniform.

The metal is selected for the galvanically deposited metal layer so that a low electrical resistance interface between the metal of the glavanically deposited layer and the first substrate and between the metal of the galvanically deposited layer and the surface of the semiconductor die is provided.

In this context, major surface is used to define the larger area surface of a geometrical form such as a cuboid. A semiconductor die typically has two opposing major surfaces whose breadth and length is larger than the thickness of the die. The side faces which define the thickness are, therefore, not denoted under major surface.

The first major surface of the semiconductor die may be provided by electrically conductive semiconductor material. The first major surface of the semiconductor may be provided, in an embodiment, by an electrically conductive metallic surface. In this context, metallic is used to include pure metals and metals comprising a small proportion, in this context less than five weight percent, preferably less than 1.5 weight percent, of one or more further elements.

For example, if the first major surface of the semiconductor die comprises a contact pad or an electrode which consists essentially of silver or gold, and if the second major surface of the substrate consists essentially of copper, the galvanically deposited metallic layer may consist essentially of copper or nickel.

Copper, nickel and their alloys may be efficiently and reliably deposited by galvanic techniques using known galvanic bath compositions and using deposition parameters within known ranges.

At least a region of the galvanically deposited metallic layer extends between the first major surface and the second major surface and may extends between essentially the whole of the first major surface and essentially the whole of the second major surface and may essentially fill the gap. The electrical contact resistance of the contact provided between the first major surface of the semiconductor die and the second major surface of the electrically conductive substrate is increasingly reduced as the area over which the two surfaces are connected by the galvanically deposited metallic layer increases.

The first major surface of the semiconductor die and the second major surface of the electrically conductive substrate are also physically and mechanically connected to one another by the galvanic metallic layer positioned directly between them. The galvanically deposited metallic layer provides a simple and compact method of electrically connecting the semiconductor die and an electrically conductive substrate. Furthermore the galvanically deposited metallic layer provides a simple and compact method of producing a large area electrical contact between a semiconductor die and an electrically conductive substrate.

The connection structure may further comprise a spacer element which is positioned in the gap between the first major surface of the semiconductor die and the second major surface of the electrically conductive substrate. The spacing element spaces the first major surface from the second major surface by a distance. The spacer element may extend between the first major surface and the second major surface.

The distance between the first major surface and the second major surface, d, may lie in the range $30\ \mu m \leq d \leq 200\ \mu m$, preferably $50\ \mu m \leq d \leq 150\ \mu m$.

A gap, which apart from the spacer element is empty, is provided between the first major surface and the second major surface so that the solution of the galvanic bath from which the metallic layer is deposited may flow into the gap and essentially fill the gap. This enables the deposition of the metallic layer from the galvanic bath solution onto at least the second major surface.

The distance d provided between the first major surface and the second major surface is chosen as a compromise between the ease and reliability of the positioning of the first major surface respect to the second major surface and the time which may be required to deposit a metallic layer which extends between the first major surface and the second major surface.

The spacing element may be provided by a single entity or may be provided by one or more physically separate entities distributed over the interface between the first major surface and the second major surface. In an embodiment, the spacing element is provided by one or more adhesive bumps positioned in the gap. The least one adhesive bump extends between the first major surface and the second major surface, spacing the first major surface from the second major surface and providing a gap having a distance d. An adhesive bump may provided by dispensing a drop of adhesive on to either the first major surface of second major surface before the two surfaces are positioned facing each other. The adhesive of the adhesive bump may comprise an electrically insulating adhesive.

The spacing element may be provided by providing the first major surface with a first mating member and the second major surface with a second mating member. The second mating member is adapted to mate with first mating member. The first and second mating members mate or interlock with each other and space the first major surface at a distance from the second major surface. In this context, the two mating members which comprise the spacing element have a form adapted to each other so that at the least the distal end of each of the first mating member and of the second rating member fit together so as to provide a mechanically stable interlocking structure. The mating members are provided with a height so that when they are mated together, the first major surface is spaced at a distance d from the second major surface. The first mating member as well as the second mating member made each comprise one or more physical entities.

In an embodiment, the first mating member may comprise at least one protrusion positioned on the first major surface of the semiconductor die. The protrusion or protrusions may be provided by increasing the thickness of one or more regions of a large area electrode which provides the first major surface. The protrusion may comprise a metal or an alloy.

Alternatively, the protrusion may be provided by one or more protrusions positioned between electrodes or contact pads positioned on the first major surface of the semiconductor die. The protrusion or protrusions may comprise metal or comprise an electrically non-conductive material, such as a structural photoresist. In this embodiment, the second mating member positioned on the second major surface comprises at least one depression in the second major surface which is adapted to mate with the least one protrusion providing the first mating member.

The lateral arrangement as well as the vertical arrangement of the protrusions and of the depressions are adapted to one another in order that each protrusion fits within a depression and a gap is provided between the first major surface and the second major surface. The depression may be provided in the second major surface of the electrically conductive substrate by selective etching.

In an embodiment, the first mating member of the first surface may comprise at least one depression and the second mating member of the second surface may comprise at least one protrusion. The depression and protrusion are adapted to mate with one another so that the first major surface is spaced from the second major surface when the first mating member mates or interlocks with the second mating member.

The application also relates to an electronic component comprising one or more connection structures according to one of the embodiments already described.

An electronic component may comprise a vertical semiconductor device, at least one electrically conductive clip and an electrically conductive chip carrier. The semiconductor device comprises a first major surface and a third major surface which opposes the first major surface. The electrically conductive contact clip comprises a second major surface. At least part of the second major surface is positioned facing towards and spaced at a distance from the first major surface to provide a first gap. The electrically conductive chip carrier comprises a fourth major surface. At least a part of the fourth major surface is positioned facing towards and spaced at a distance from the third major surface to provide a second gap. A first galvanically deposited metallic layer extends between the first major surface and the second major surface and electrically connects the semiconductor device with the contact clip. A second galvanically deposited metallic layer extends between the third major surface and the fourth major surface and electrically connects the semiconductor device and the chip carrier.

The first galvanically deposited metallic layer is electrically conductive and physically connects the semiconductor device and the contact clip. The second galvanically deposited metallic layer is also electrically conductive and physical connects the semiconductor die and the chip carrier.

The first galvanically deposited metallic layer is physically separate from the second galvanically deposited metallic layer. The contact clip is physically isolated from the chip carrier and the first surface of the vertical semiconductor device is not electrically connected by a glavanically deposited layer to the third major surface of the vertical semiconductor device. The side faces of the semiconductor die are free from the galvanically deposited metal layers The first and second galvanically deposited metallic layers may, however, comprise essentially identical compositions and have a similar average thickness as the first and second plurality deposited metallic layers may be deposited in the same process step. Two or more physically separate electrical connections may be provided by single method step.

The first galvanically deposited metallic layer may also be positioned on further surfaces of the contact clip which do not face towards the first major surface of the vertical semiconductor device. The contact clip may comprise a flat web portion having a lower surface which provides the second major surface and a peripheral rim portion which extends from an edge region of the flat web portion in directions towards the vertical semiconductor device and towards the upper surface of the chip carrier. The peripheral rim portion may then extend into a foot region which is positioned approximately parallel to the flat web portion and extends in a direction away from the vertical semiconductor device. For example, the first galvanically deposited metallic layer may also coat the upper surface of the contact clip, the peripheral rim portion and the foot portion of the contact clip.

Similarly, the side faces and the lower side of the chip carrier may also be coated by the second galvanically deposited metallic layer.

In an embodiment, the lower surface of the foot region of the contact clip is kept free of the first galvanically deposited metal layer and the lower surface of the chip carrier is kept free from the second galvanically deposited metallic layer. This may be provided by coating the surfaces with a protective layer before the galvanic deposition process is carried out. The protective layer may then be removed after the galvanic the position process to provide free surfaces which comprise the material of the contact clip and chip carrier respectively. This embodiment may be provided if the material of the galvanically deposited metallic layers is not easily wettable by soft solder whereas the material of the contact clip and chip carrier is wettable by soft solder. In this embodiment, the lower surface of the chip carrier and the lower surface of the foot region of the contact clip provide outer contact surfaces of the electronic component.

The first major surface is provided by the vertical semiconductor device and may be spaced from the lower surface of the contact clip, which provides the second major surface of the connection structure, by a spacing element according to one of the embodiments previously described.

The third major surface of the connection structure, which is provided by the surface of the vertical semiconductor device which opposes the first surface, may be spaced at a distance from the fourth major surface, provided by the upper surface of the chip carrier, by a distance d so that the first gap has a height approximately the height of the second gap. This simplifies the deposition procedure since the deposition rate of the first and second metallic layers from the galvanic bath is time dependent. Therefore, if a similar distance is to be filled by the metallic layer which extends between adjacent the arranged surfaces, the time which may be required for the deposition of both first metallic layer and the second metallic layer can be approximately the same so that the overall deposition time is minimised.

The third major surface and the fourth major surface may be spaced from one another by second spacing element. The second spacing element may be provided by spacing element according to one of the embodiments already described for spacing the first major surface from the second major surface. The second spacing element may, therefore, comprise one are more adhesive bumps, whereby the adhesive bumps may comprise electrically insulating adhesive. The spacing element may also be provided by providing the third major surface with a third mating member and the fourth major surface with a fourth mating member according to one of the embodiments already described.

The vertical semiconductor device may be a vertical diode, vertical transistor or vertical power transistor. The vertical power transistor may be a power MOSFET (Metal Oxide Semiconductor Field Effect Transistor) device, an IGBT (Isolated Gate Bipolar Transistor) or BJT (Bipolar Junction Transistor). For a transistor device, one surface comprises a first load electrode and a control electrode and the opposing surface comprises a second load electrode. In a MOSFET device, the first load electrode is a source, the control electrode gate, and the second of electrode is a drain. In an IGBT device, the first load electrode is an emitter, the control electrode is gate and the second load electrode is a collector. In a BJT device, first load electrode is a emitter, the control electrode is a base and the second load electrode is a collector.

The vertical power transistor may be mounted with the second load electrode electrically connected to the chip carrier or with the second load electrode electrically connected to the contact clip. In the latter arrangement, two chip carriers are provided which are physically separate from one another. The first load electrode is electrically connected to a first chip carrier and the control electrode is electrically connected to a second chip carrier. In the former arrangement, in which the second load electrode is electrically connected to the chip carrier, a further contact clip may be provided which is electrically connected the control electrode and which is physically separate form the first contact clip which is electrically connected to the first load electrode.

If a vertical power transistor is provided, a third galvanically deposited metallic layer is provided which is physically and electrically separate from both the first and the second galvanically deposited metallic layers. The third galvanically deposited layer electrically connects the control electrode to the second chip carrier portion or to a second contact clip in the case where the second load electrode is mounted on the chip carrier.

The one or more contact clips may each be provided with a plurality of through-holes which extend from one major surface to the opposing major surface. This enables the liquid of the galvanic bath to flow through the holes and improves the deposition of the galvanically deposited metallic layers onto the surfaces positioned underneath the contact clip.

In an embodiment, an electronic component comprises a lateral semiconductor device and at least one electrically conductive lead. The lateral semiconductor device comprises a first major surface and a third major surface which opposes the first major surface. The at least one electrically conductive lead comprises a second major surface. At least part of the second major surface is positioned facing towards and spaced at a distance from the first major surface to provide a first gap. A first galvanically deposited metallic layer extends between the first major surface and the second major surface and electrically connects the semiconductor device with the lead.

A lateral semiconductor device is used here to denote a lateral transistor device and to denote a an IC device. A lateral semiconductor device is, therefore, used to denote a semiconductor device in which the contact areas which are to be electrically connected by the rewiring structure of the package are arranged on only one major surface of the semiconductor device.

An electronic component which comprises a lateral semiconductor device may comprise a plurality of electrically conductive leads. The number of electrically conductive leads may correspond to the number of contact areas which are to be independently electrically accessed. The electrically conductive leads may be provided by lead fingers or contact clips. Each lead is positioned directly above a contact area and may be approximately parallel to the outermost surface of the contact area.

A spacing element may be provided which is positioned in the first gap and spaces the first major surface of the lateral semiconductor device from the second major surface of the electrically conductive lead.

If two or more electrically conductive leads are provided, a spacing element may be provided for each of the conductive leads. Alternatively, a single spacing element may be provided which spaces all of the electrically conductive leads at a distance from the first major surface of the lateral semiconductor device. This may be provided by providing a frame-like protrusion around the peripheral edge regions of the first surface of the semiconductor device. The spacing element may be provided in a form as previously described. The spacing element may comprise one are more adhesive bumps. The spacing element may be provided by a pair of mating members which interlock with one another.

The application also provides a method of producing a connection structure. A semiconductor die is provided which comprises a first major surface and a first electrically conductive substrate is provided which comprises a second major surface. At least part of the second major surface is positioned facing towards the first major surface and the second major surface is spaced at a distance from the first major surface to provide a gap. A metallic layer is galvanically deposited at least on the second major surface. The galvanic deposition is continued until the metallic layer extends between the first major surface and the second major surface and the galvanically deposited metallic layer electrically connects the first major surface and the second major surface.

After the first major surface of the semiconductor die and the second major surface of the electrically conductive substrate have been positioned facing one another and spaced from one another by a gap, the assembly is positioned in a galvanic bath. Galvanic bath comprises a solution with ions of the metal which is to be galvanically deposited to form a metallic layer and to produce a connection structure between the semiconductor die and the electrically conductive substrate. The galvanic bath further comprises cations in order to provide charge balance and may comprise further ions of activators, pH buffers and stabilizers for example, as is known in the art.

The metallic layer may be galvanically deposited by applying a voltage between the assembly and a further electrode. Alternatively, a currentless galvanic deposition process may be used to deposit the metallic layer from the galvanic bath. Galvanic baths of a known composition may be conveniently used. The thickness of the metallic layer which is deposited during the galvanic deposition process, depends on the length of time that the galvanic deposition is carried out, the layer becoming thicker the longer the process is carried out. The galvanic deposition is continued until the metallic layer extends at least in part between the first major surface and the second major surface. Preferably, the metallic layer extends between the majority of the first major surface and the majority of the second major surface and, even more preferably comprises few spaces or holes and even more preferably is hole-free.

The galvanic deposition process may be carried out at room temperature or at a temperature only slightly above room temperature, for example less than 60° C., preferably less than 50° C., more preferably less than 40° C. Damage to the semiconductor die by high deposition temperatures, as are typically used in soldering processes, in particular diffusion solder processes, is avoided.

Galvanic deposition also enables the cost of electrical connection to be reduced since only the material which is actually deposited to form the connection structure is removed from the galvanic bath. This is in contrast to vacuum deposition techniques such as sputtering, thermal evaporation, chemical and physical vapour deposition in which the whole chamber, in addition to the object which is to be coated, is also coated with the source material. This material cannot usually be reused and is normally wasted.

The gap between the first major surface of the semiconductor die and the second major surface of the first electrically conductive substrate may be provided by positioning one or more adhesive bumps on one are more of the first major surface and the second major surface. The adhesive bump or bumps may be conveniently deposited by a dispensing technique.

The gap between the first major surface of the semiconductor die and the second major surface of the first electrically conductive substrate may be provided by providing the first major surface with a first mating member and the second mating surface with a second mating member. The first and second mating member side that had to mate with each other.

The first mating member may be provided by forming at least one protrusion on the first major surface of the semiconductor die. This may be achieved by selective deposition of a metal, an alloy or electrically insulating material such as polymer, or a ceramic. Alternatively, a layer may be deposited which is then structured to provide one or more protrusions of the desired size and lateral position. In an embodiment, the first major surface of the semiconductor die is provided by at least one electrode which comprises a metal layer. A protrusion may be formed by increasing the thickness of the electrode in a defined region by selective deposition of the metal which comprises the electrode.

A depression may be formed in the second major surface by selective etching of the second major surface. The three-dimensional form and lateral positioning of the protrusion or protrusions and depression or depressions is selected so that each protrusion mates with a depression so as to space the first major surface from the second major surface and provide a gap which is initially free from material apart from the spacing elements.

A method to produce an electrically conductive connection may also comprise producing one or more further electrically conductive connections between the opposing surface of the semiconductor die, which is denoted the third major surface, and a second electrically conductive substrate which comprises a fourth major surface.

A second electrically conductive substrate is provided which comprises a fourth major surface. At least a part of the fourth major surface is positioned facing towards and spaced at a distance form the third major surface of the semiconductor die to provide a second gap. A galvanic deposition process is carried out, during which a first galvanically deposited metallic layer is deposited which extends between the first major surface and the second major surface and which electrically connects the semiconductor die with the first electrically conductive substrate and a second metallic layer is galvanically deposited which extends between the third major surface and the fourth major surface and which electrically connects the semiconductor die and the second electrically conductive substrate.

The first galvanically deposited metallic layer is physically separate from the second galvanically deposited metal layer. In this embodiment, two physically separate connection structures are deposited essentially simultaneously. This embodiment may be conveniently used for a semiconductor die which is a vertical semiconductor device in which case a connection structure to the two opposing surfaces of the semiconductor device may be produced in the same deposition process.

In an embodiment, the first substrate is one of a contact clip, a lead and a chip carrier and the semiconductor die is one of a vertical diode, a vertical transistor and a lateral semiconductor die. In an embodiment, the first substrate may be the contact clip or a lead, the semiconductor die is the vertical diode or a vertical power transistor and the second substrate is a chip carrier.

The electronic component may also further comprise a plastic encapsulation compound which encapsulates the semiconductor device and the upper and side faces of both the contact clip and the chip carrier. The plastic encapsulation compound may also provide a further electrical isolation between the first and second galvanically deposited metallic layers in addition to environmental protection for the semiconductor device.

In an embodiment of the method, a plurality of physically separate connection structures are deposited during the same deposition process for a plurality of electronic components. A first leadframe strip comprising a plurality of device positions is provided. Each device position provides a contact clip providing a first substrate which comprises a second major surface. A second leadframe strip is provided which comprises a plurality of device positions. Each device position comprises a chip carrier providing a second substrate which comprises a fourth major surface. A plurality of semiconductor dies is also provided, each comprising a first major surface and a third major surface which opposes the first major surface. The first leadframe strip, the second leadframe strip and the plurality of semiconductor dies are arranged so that during the galvanic deposition a metallic layer is deposited between the first major surface and the second major surface and between the third major surface and the fourth major surface in each of the device positions.

The first leadframe strip and second leadframe strip are therefore arranged so as to sandwich one or more semiconductor dies between the second major surface of each device position of the first leadframe strip and the fourth major surface of each device position of the second leadframe strip. A first gap is provided between the semiconductor die and the upper surface of the chip carrier and a second gap is provided between the semiconductor die and the lower surface of the flat web portion of the contact clip.

The galvanic deposition process is then carried out so that a plurality of physically separate metallic layers is deposited so as to provide an electrically conductive connection between the first major surface of the semiconductor die and the contact clip and between the third major surface of the semiconductor die and the chip carrier in each of the device positions provided by the first and second leadframe strips respectively.

The first leadframe strip, the semiconductor die and second leadframe strip may be spaced from one another using a spacing element according to one of the embodiments already described. Mechanical pressure may be exerted on one the outermost surfaces of the two leadframe strips in order to hold the assembly in place during the initial stages of the galvanic deposition process until the connection structures are deposited which physically, as well as electrically, connect the plurality of semiconductor die with its respective contact clip and chip carrier.

In an embodiment, each device position of the second leadframe strip may comprise two chip carriers. This embodiment of the second leadframe strip may be used if the semiconductor device is a vertical transistor device and if the first load electrode is to be connected to the first chip carrier and the control electrode is to be connected to the second chip carrier in each device position.

The application also relates to the use of galvanic deposition to provide an electrical connection between a semiconductor die and an electrically conductive substrate positioned facing towards it. The method of using galvanic deposition provides an electrically conductive mechanical connection between the semiconductor die and an electrically conductive substrate. Galvanic deposition may be used to provide an electrically conductive connection between a semiconductor die and one of clip, a lead and a chip carrier. The semiconductor die may be a vertical diode, a vertical transistor or a lateral semiconductor device. The lateral semiconductor device may be a lateral transistor or an IC chip.

Galvanic deposition is also used to produce two or more physically separate electrically conductive connection structures for an electronic component during the same deposition process. A rewiring structure for one or more electronic components which comprises two or more physically separate electrical connections is provided by the use of galvanic deposition.

Figure 1:
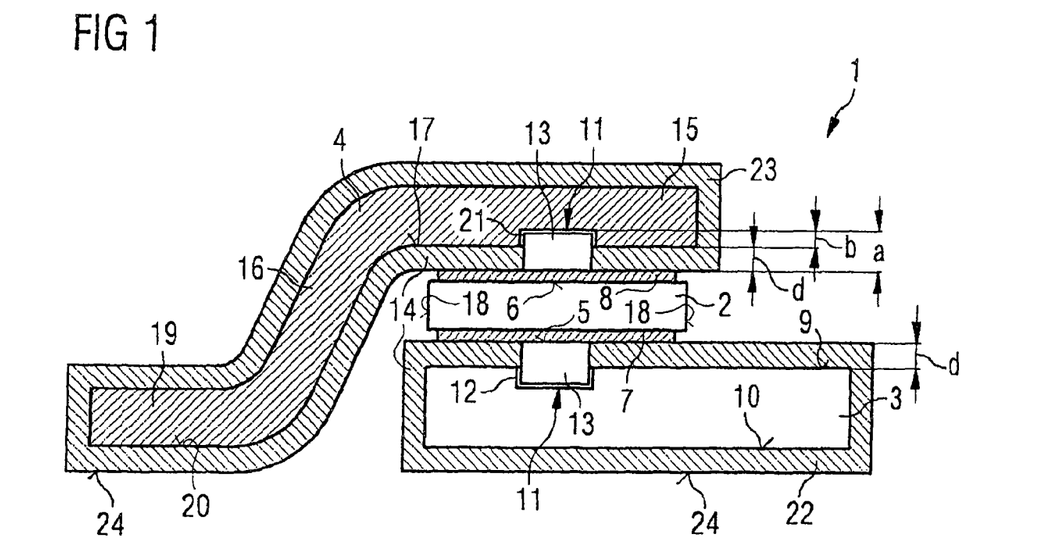
FIG. 1 illustrates a connection structure between a semiconductor die and an electrically conductive substrate according to a first embodiment.

FIG. 1 illustrates an electronic component 1 comprising a vertical semiconductor diode 2, a chip carrier 3 and a contact clip 4 according to a first embodiment of the invention.

The vertical diode 2 has a first surface major surface 5 and a second major surface 6 which opposes the first major surface 5. The first major surface 5 comprises a cathode electrode 7 which comprises a layer of gold. The second major surface 6 comprises anode electrode 8 which also comprises a layer of gold. The chip carrier 3 comprises metal sheet and has an upper surface 9 and lower surface 10. The upper surface 9 of the chip carrier 3 faces towards the first major surface 5 of the vertical diode 2. The outermost surface of the cathode electrode 7 is spaced at a distance form the upper surface 9 of the chip carrier 3 by distance denoted in FIG. 1 as d, by a single spacer element 11.

The first major surface 5 of the vertical diode 2 is positioned approximately parallel to the upper surface 9 of the chip carrier 3. The second major surface 6 of the vertical diode 2 is also approximately parallel to the first major surface 5 and to the upper surface 9 of the chip carrier 3.

In this embodiment, the spacer element 11 comprises a depression 12 and a protrusion 13 which are adapted to mate with each other. The protrusion 13 is provided in the form of a thicker region of the cathode 7 and comprises copper. The protrusion 13 was produced by selective deposition of copper on the cathode electrode 7. The protrusion 13 has a height, a, which is greater than the distance, d, between the first major surface 5 of the die 2 and the upper surface 9 of the chip carrier 3.

The upper surface 9 of chip carrier 3 comprises a depression 12 which has a lateral size and position adapted to accommodate the lateral dimensions of the protrusion 13. The depression 12 has a depth, b, which is less than the height a of the protrusion 13 and where a≈b+d. The protrusion 13 and the depression 12 provide the first mating member and a second mating member, respectively, which when assembled provide a distance between first major surface 5 of the diode 2 and the upper surface 9 of the chip carrier 3 of d.

Similarly, a second spacing element 11 is positioned on the anode electrode. The second spacing element 11 also comprises a protrusion 13 having essentially the same dimensions as the protrusion 13 positioned on the cathode electrode 7.

The contact clip 4 comprises a flat web portion 15 which in an edge region extends into a peripheral rim portion 16. The peripheral rim portion 16 extends in directions towards the lower surface 17 of the flat web portion of the contact clip 4 and away from the side face 18 of vertical diode 2. The distal end of the peripheral rim portion 16 extends into a foot region 19 which extends in directions away from the side face 18 of the vertical diode 2. The lower surface 17 of the flat web portion 15 and lower surface 20 of the foot region 19 of contact clip 4 lie in planes approximately parallel to each other and parallel to the first major surface 5 and second major surface 6 of the diode 2. The lower surface 20 of the foot region 19 is essentially coplanar with the lower surface 10 of the chip carrier 3. The contact clip 4 comprises copper and comprises a metal foil or sheet which has been stamped from a metal sheet and bent to provide the required form.

The lower surface 17 of the flat web portion 15 also comprises a depression 21 with dimensions which correspond essentially to the dimensions of the depression 12 in the upper surface 9 of the chip carrier 3. The lateral arrangement of the depression 21 in the lower surface 17 of the flat web portion 15 is adapted so that the distal end of the protruding element 13 is accommodated within the depression 21. The depth of the depression 21 and the height of the protrusion 13 are also adapted so that when the depression 21 is mounted on, and mates with, the protrusion 13 the distance between the lower surface 17 of the flat web portion 15 and the second major surface 6 of diode 2 is approximately d. In this embodiment this distance d is approximately 100 μm.

The electronic component 1 further comprises a first metallic connection layer 22 which electrically connects the cathode electrode 7 of the diode 2 to the chip carrier 3. The first metallic connection layer 22 is a galvanically deposited layer of nickel which has an average thickness of approximately d and covers all of the exposed surfaces of the chip carrier 3. The first galvanically deposited metallic layer 22 therefore extends directly between the upper surface 9 of the chip carrier 3 and the outermost surface 5 of the of the cathode electrode 7 of diode 2 and essentially fills the gap 14 provided by the spacing element 11. The first galvanically deposited metal layer 22 electrically connects the cathode electrode 7 to the chip carrier 3 as it extends directly between the surface region of the chip carrier 3 which is covered by the cathode electrode 7. The area occupied by the protrusion 13 and depression 12 is not filled by the first metallic layer 22.

A second galvanically deposited metal layer 23 covers the outermost surfaces of contact clip 4. The second galvanically deposited metal layer 23 also comprises copper and also has an average thickness of approximately d, which is this embodiment is approximately 100 μm. The second metallic layer 23 essentially fills the gap 14 between the lower surface 17 of the flat web portion 15 and the outermost surface 6 of the anode electrode 8. The second galvanically deposited metal layer 23, therefore, extends directly between the lower surface 17 of the contact clip 4 and the anode electrode 8, thus electrically conducting them. The first galvanically deposited layer 22 and the second galvanically deposited layer 23 are physically separate from one another.

The mechanically deposited layers 22, 23 provide two separate physical and mechanical connections, one positioned directly between the cathode electrode 7 chip carrier 3 and one positioned directly between the contact clip 4 and the anode electrode 8. Since the galvanically deposited layers 22, 23 comprise electrically conductive metal, these layers also provide the electrical connection between the two electrodes 7, 8 of the diode 2 and the chip carrier 3 and the contact clip 4, respectively.

The outermost surface of the first metallic layer 22 which is positioned on the lower surface 10 of the chip carrier 3 provides an outer contact surface 24 of electronic component 1 which will be mounted on a high-level circuit board. Similarly, the outermost surface 24 of the second metal layer 23 positioned on the lower surface 20 of the foot region 19 of contact clip 4 also provides an outer contact surface 24 of electronic component 1.

The electronic component 1 may also comprise a plastic encapsulation compound, not illustrated in FIG. 1, which encapsulates the diode 2 and upper and side surfaces of the contact 4 and chip carrier 3, respectively. The lower surfaces 24 of the chip carrier 3 and contact clip 4, which provide the outer contact surfaces of the electronic component 1, remain uncovered by the plastic encapsulation compound.

The electronic component 1 may be assembled by providing a first lead leadframe strip which comprises a plurality of contact clips 4, one contact clip 4 being arranged in each of a plurality of device positions. A second leadframe strip is provided which also comprises a plurality of device positions. In the second leadframe strip, each device position provides a chip carrier 3 for electronic component 1. The upper surface 9 of each of the chip carriers 3 comprises a depression 12 which is adapted to mate with a protrusion 13 provided on the cathode contact of diode 2. Similarly, the lower surface 17 of each of the flat web portions 15 of the plurality of contact clips 4 also comprises a depression 21 adapted to mate with the protrusion 13 positioned on the anode contact 8 of diode 2.

A diode 2 is positioned on the upper surface 9 of each of the chip carriers 3 of the second leadframe strip so that the protrusion 13 mates with the depression 12 of the chip carrier 3 in each of the device positions. The second leadframe strip is positioned over the second major surface 6 of each of the plurality of diodes 2 so that the depression 21 is placed over the distal end of the protrusion 13 positioned on the anode 8 in each of the device positions. The assembly may be held together by applying mechanical pressure to the upper surface of the first leadframe strip and/or lower surface of the second leadframe strip.

The lower surface 17 of the flat web portion 15 is spaced at distance of approximately d from the second major surface 6 of diode 2 and the upper surface 9 of the chip carrier 3 is spaced at distance of approximately d from the first major surface 5 of the cathode contact 7 of the diode 2. The gaps 14 created between the diode 2 and the chip carrier 3 and contact clip 4, respectively, are empty and unfilled at this stage.

This assembly is placed in a galvanic deposition bath and a galvanic deposition process carried out in which a first metallic layer 22 is deposited on the outermost surfaces of the chip carrier 3. As the thickness of the deposited layer 22 increases, the space between the upper surface 9 of the chip carrier 3 and the outermost surface 5 of the cathode 7 becomes smaller and eventually is at least partially filled so that at least regions of the first metallic layer 22 extend directly between the upper surface 9 of the chip carrier 3 and the outermost surface 5 of the cathode 7.

These regions which extend directly between the these two adjacent surfaces provide a physical connection as well as an electrical connection between the cathode 7 and the chip carrier 3.

During the deposition process, a second metal metallic layer 23 is deposited on the contact clip 4. The second metal layer 23 covers the outermost surfaces of the contact clip 4 and deposition is continued until the gap 14 or space formed between the lower surface 17 of the flat web portion 15 and the outermost surface 6 of the anode contact 8 is at least partially filled by the deposited metal layer 23. At least regions of the second metal layer 23 extend directly between the lower surface 17 of contact clip 4 and the outermost surface 6 of the anode 8 to physically and electrically connect the contact clip 4 to the anode contact 8. The two deposited metal layers 22 and 23 are not, however, connected to each other and are physically separate from each other.

After the two metallic layers 22, 23 have been galvanically deposited, the composite structure formed by the two leadframe strips and diodes 2 is removed from the galvanic bath and may be subjected to a further molding process to encapsulate the diode 2, and upper and side surfaces of the chip carrier 3 and of the contact clip 4 of each of the electronic components 1. The lower surfaces 24 of the first metallic layer 22 second metallic layer 23 which are positioned on the lower surface 10 of the chip carrier 3 and foot region 19, respectively, remain free from the plastic encapsulation compound and provide the outer contact surfaces of the electronic component 1. The individual electronic components 1 may then be singulated from the composite assembly formed by the two leadframe strips and plurality of diodes 2.

Figure 2:
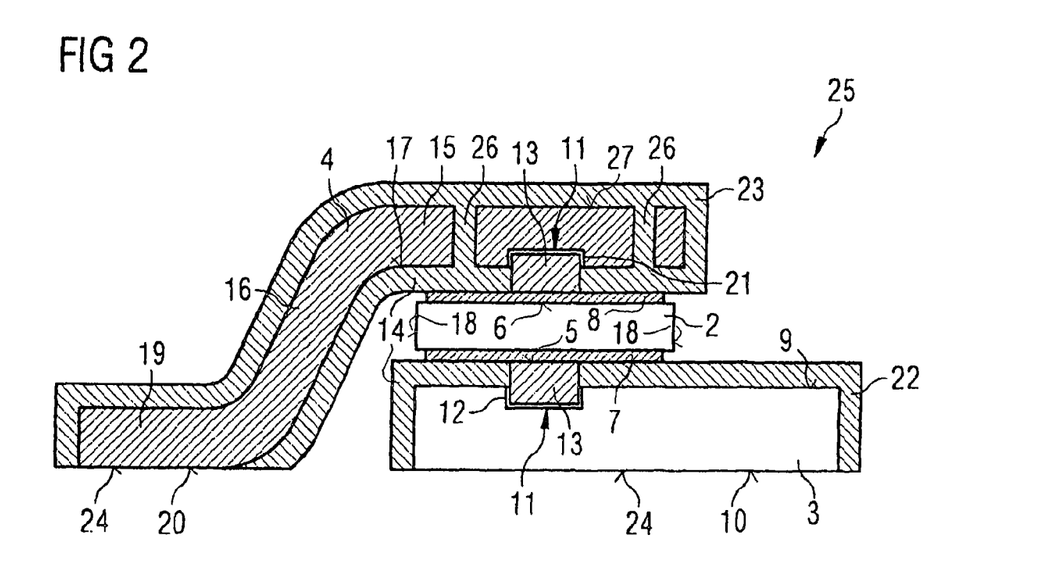
FIG. 2 illustrates a connection structure between a semiconductor die and an electrically conductive substrate according to a second embodiment.

FIG. 2 illustrates an electronic component 25 according to a second embodiment. The second electronic component 25 comprises a diode 2, a chip carrier 3 and a contact clip 4 as illustrated in FIG. 1 for the first embodiment.

In the second embodiment, the contact clip 4 further comprises a plurality of through holes 26 positioned in the flat web portion 15 of the contact clip 4. Each of the through holes 26 extend from the upper surface 27 to lower surface 17 of the flat web portion 15 of contact clip 4. At least some of the plurality of through-holes 26 are positioned above the anode contact 8 of the diode 2. The through-holes 26 enable the solution of the galvanic bath to more easily enter the volume between the lower surface 17 of contact clip 4 and the outermost surface 6 of the diode 2. During galvanic deposition, any gases which made the created may also more easily escape through the through-holes 26 away from the interface region between the contact clip 4 and the diode 2. The quality of the metal layer 23 positioned in the contact region between the contact clip 4 and the diode 2 may be improved.

In this embodiment, the chip carrier 3 and contact clip 4 each consist essentially of copper and the galvanically deposited metal layers 22, 23 consist essentially of nickel.

Depending on the diameter of each of the through-holes 26, the through-holes 26 may be completely filled by the galvanically deposited metal layer 23 or may comprise a coating on the side walls of the through-holes 26 and the centre region of the through-holes 26 remains free from the second metal coating 23. The through-holes 26 may be produced in the contact clip 4 by etching, stamping or drilling.

The electronic component 25 according to the second embodiment also differs from the electronic component 1 according to the first embodiment, in that the lower surface 10 of the chip carrier 3 and the lower surface 28 of the foot region 19 of the contact clip 4 remain uncovered by the galvanically deposited metal layers 22, 23 respectively. The lower surface 10 of the chip carrier 3 and the lower surface 20 of the foot region 19 provide the outer contact surfaces of the electronic component 25 which may be easily soldered.

The lower surface 10 of the chip carrier 3 and the lower surface 20 of foot region 19 of contact clip 4 may be covered by a protective layer prior to the deposition of the metallic layers 22, 23. The protective layer may be provided by an organic surface protection layer or an adhesive foil. The protective layer is then removed after the galvanic deposition process has been carried out to expose the lower surface 10 of the leadframe 3 and lower surface 20 of the foot region 19 of contact clip 4.

Figure 3:
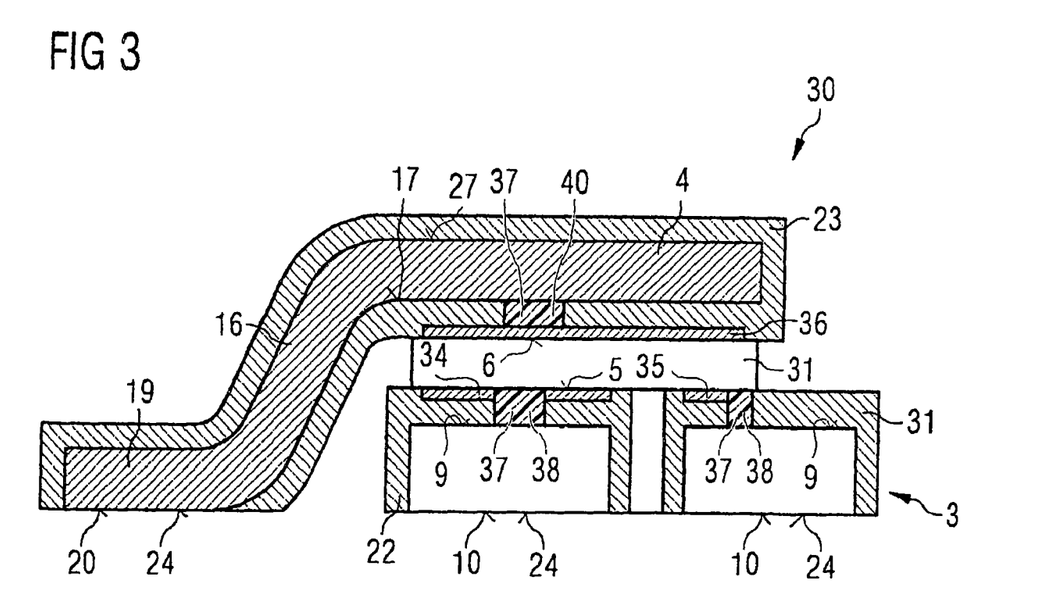
FIG. 3 illustrates a connection structure between a semiconductor die and an electrically conductive substrate according to a third embodiment.

FIG. 3 illustrates an electronic component 30 according to the third embodiment. The electronic component 30 comprises a vertical power MOSFET device 31, a chip carrier 3 and a contact clip 4.

In the third embodiment, the chip carrier 3 comprises two chip carrier portions 32, 33 which are physically separate from each other and arranged adjacent one another. The two chip carrier portions 32, 33 each have an upper surface 9 which are essentially coplanar with one another and a lower surface 10 which opposes the upper surface 9 and which are essentially coplanar with one another. The vertical MOSFET device 31 has a first surface 5 which comprises a source electrode 34 and a gate electrode 35. The gate electrode 35 is laterally smaller than the source electrode 34 and is positioned in an edge region of the first surface 5. In view of the electronic component 30 illustrated in FIG. 3, the gate electrode 35 is positioned towards the right hand side. The second surface 6 of the MOSFET device 31 comprises a drain electrode 36 which extends over the majority of the second surface 6.

In the third embodiment, the first major side 5 of the MOSFET device 31 is spaced from the upper surface 9 of the two portions 32, 33 of the chip carrier 3 by a plurality of adhesive bumps 37. A plurality of adhesive bumps 38, of which one is visible in the cross-sectional view of FIG. 3, is positioned on the region of the first surface 5 in which the source electrode 34 is positioned. A further adhesive bump 39 is positioned at the periphery of the first surface 5 outside of the gate electrode 35. In contrast to the first and second embodiment, the upper surface 9 of the chip carrier 3 and the lower surface 17 of the flat web portion 15 of the contact clip 4 are free from depressions.

The MOSFET device 31 is arranged with its first surface 5 facing downwards towards the upper surface 9 of the leadframe 3. The source electrode 34 is arranged facing towards and is positioned above the upper surface 9 of the first portion 32 of the chip carrier 3 and the gate electrode 35 is positioned above and facing towards the upper surface 9 of the second portion 33 of the chip carrier 3. The MOSFET device 31 is arranged so that the first adhesive bumps 38 positioned in the source electrode 34 region are mounted on the upper surface 9 of first portion 32 of the chip carrier 3 and so that the adhesive bump 39 positioned at the periphery outside of the gate electrode 35 is positioned on the upper surface 9 of the second portion 33 of the chip carrier 3. The MOSFET device 31 extends over the region which physically separates the two separate portions 32, 33 of the chip carrier 3.

The plurality of adhesive bumps 37 each have a height which spaces the first surface 5 of the MOSFET device 31 from the upper surface 9 of the chip carrier 3 so as to create a gap 14 between the surfaces. Each of the adhesive bumps 37 has a height of approximately, d, which, in this embodiment, is approximately 50 µm. The upper surface 9 of the two portions of the chip carrier 3 is uniform and free from depressions. Similarly, depressions are not provided in the lower surface 17 of the contact clip 4.

The drain electrode 36 faces upwards away from the chip carrier 3. A further adhesive bump 40 is positioned on the drain electrode 36 which also has a height of approximately 50 µm. The contact clip 4 has essentially the same form as that shown in the first and second embodiments of FIGS. 1 and 2. The lower surface 17 of the flat web portion 15 of the contact clip 4 is positioned on the distal end of the adhesive bump 40 positioned on the drain electrode 36. The lower surface 17 of the flat web portion 15 of the contact clip 4 is positioned above the drain electrode 36 and is spaced at a distance d of around 50 µm from the drain electrode 36 by the adhesive bump 40.

The MOSFET device 31 comprises electrodes, that is a source electrode 34, a gate electrode 35 and drain electrode 36, which each have a uniform outermost surface without a protrusion. The use of adhesive bumps to provide the spacing elements enables an unmodified MOSFET device 31, without additional protrusions or depressions which form part of a spacing structure, to be used.

The electronic component 30 comprises three galvanically deposited metallic layers. The first metallic layer 22 is positioned on the upper surface 9 and side faces of the first portion 32 of the chip carrier 3 and a portion of the first metallic layer 22 extends between the upper surface 9 of the first portion 32 of the chip carrier 3 and the source electrode 34. The first metallic layer 22, therefore, physically and electrically connects the source electrode 34 with the first portion 32 of the chip carrier 3.

The second metallic layer 23, similarly to that shown in the first and second embodiments of FIGS. 1 and 2, covers the outer surfaces of contact clip 4 and extends between the lower surface 17 of the flat web portion 15 and the upper surface 6 of the drain electrode 36 of MOSFET device 31. A portion of the second galvanically deposited metallic layer 23 extends directly between the lower surface 17 of flat web portion 15 of the contact clip 4 and the outermost surface 6 of the drain electrode 36. The second galvanically deposited layer 23, therefore, electrically and physically connects the contact clip 4 to the drain electrode 36 of the MOSFET device 31.

The electronic component 30 further comprises a third galvanically deposited metal layer 41 which is positioned on the side and upper surfaces of the second portion 33 of the chip carrier 3. A region of the third galvanically deposited metallic layer 41 extends between the gate electrode 35 and the upper surface 9 of the second portion 33 of the chip carrier 3 and physically and electrically connects the gate electrode 35 with the second portion 33 of the chip carrier 3.

The three galvanically deposited metallic layers 22, 23 and 33 are all physically separate from one another. Therefore, the three electrodes of the MOSFET device 31 are independently electrically accessible from the two portions of the chip carrier 3 and contact clip 4.

In the third embodiment illustrated in FIG. 3, the lower surfaces of the two chip carrier portions 32, 33 and of the foot region 19 of the contact lead 4 remain free from the galvanic deposited metallic layers 22, 41, 23, respectively and form the outer contact surfaces 24 of the electronic component 30. The electronic component 30 also comprises a plastic encapsulation compound which is not illustrated in FIG. 3. The plastic encapsulation compound encapsulates the MOSFET device 31 and the upper and side faces of the chip carrier 3 and contact clip 4. The plastic encapsulation compound also provides further electrical isolation between the first galvanically deposited metallic layer 22, the second galvanically deposited metallic layer 23 and the third galvanically deposited metallic layer 41.

The electronic component 30 is assembled by providing a first leadframe strip comprising a plurality of device positions, each device position providing a contact clip 4 for an electronic component 30. The second leadframe strip is provided which comprises a plurality of device positions, each device position comprising two chip carrier portions 32, 33 for an electronic component 30. The lower surfaces 10 of the chip carrier portions 32, 33 as well as the lower surface 20 of the foot region 19 of the contact clip 4 are covered by a protective coating.

A plurality of adhesive bumps 37 are dispensed onto the upper surface 9 of each of the chip carrying region 32, 33 and the MOSFET device 31 placed on top of the adhesive bumps 37 so that the gate electrode 35 is positioned directly above, and spaced at a distance by the adhesive bump 39, from the second portion 33 of the chip carrier 3 and so that the source electrode 34 is positioned directly above, and spaced at a distance from, the upper surface 9 of first chip carrier portion 32.

A further adhesive bump 40 is dispensed on the drain electrode 36 which faces upwards away from the chip carrier 3. The second leadframe strip comprising a plurality of contact clips 4 is arranged so that the flat web portion 15 is positioned above and spaced at a distance from the drain electrode 36 on the outwardly facing side of the MOSFET device 31 and so that the lower surface 20 of the foot region 19 is positioned adjacent the first portion 32 of the chip carrier 3 and so that the lower surface 20 is approximately coplanar with the lower surface 10 of each of the chip carrying portions 32, 33.

The assembly is placed in a galvanic bath and a galvanic deposition process carried out in order to deposit the three metallic layers 22, 23 and 41.

After the deposition of the metallic layers, the source electrode 34 is electrically and physically connected by the first metallic layer 22 to the first portion 32 leadframe 3, the gate electrode 35 is electrically and physically connected to the second portion 33 the chip carrier 3 by the third metallic layer 41 and the drain electrode 38 is physically and electrically connected to the contact clip 4 by the second metallic layer 23.

The assembly is then removed from the galvanic bath and the individual electronic components 30 singulated from the composite panel formed by the two leadframe strips and the plurality of MOSFET devices. Before the electronic component 30 singulated from the composite leadframe strip structure, a molding process may be carried out to provide a plastic housing for each of the electronic components 30.

REFERENCE NUMBERS 1 first electronic component
2 vertical diode
3 chip carrier
4 contact clip
5 first major surface of diode
6 second major surface of diode
7 cathode electrode
8 anode electrode
9 upper surface of chip carrier
10 lower surface of chip carrier
11 spacing element
12 depression
13 protrusion
14 gap
15 flat web portion
16 peripheral rim portion
17 lower surface of flat web portion
18 side face of diode
19 foot region
20 lower surface of foot region
21 depression
22 first galvanically deposited metallic layer
23 second galvanically deposited metallic layer
24 outer contact surface
25 second electronic component
26 through-hole
27 upper surface of contact clip
30 third electronic component
31 vertical power MOSFET
32 first chip carrier portion
33 second chip carrier portion
34 source electrode
35 gate electrode
36 drain electrode
37 adhesive bump
38 first adhesive bump
39 second adhesive bump
40 third adhesive bump
41 third galvanically deposited metal layer

What is claimed is:

1. An electronic component, comprising a vertical semiconductor device comprising
a first major surface and a third major surface which opposes the first major surface,
an electrically conductive contact clip comprising a second major surface, wherein at least part of the second major surface is positioned facing towards and spaced at a distance from the first major surface to provide a first gap,
an electrically conductive chip carrier comprising a fourth major surface, wherein at least a part of the fourth major surface is positioned facing towards and spaced at a distance from the third major surface to provide a second gap,
wherein a first galvanically deposited metallic layer extends between the first major surface and the second major surface and electrically connects the semiconductor device with the contact clip and a second galvanically deposited metallic layer extends between the third major surface and the fourth major surface and electrically connects the semiconductor device and the chip carrier.

2. An electronic component according to claim 1, further comprising a first spacing element positioned in the first gap to space the first major surface from the second major surface and a second spacing element positioned in the second gap to space the third major surface from the fourth major surface.

3. An electronic component according to claim 2, wherein at least one of the first spacing element and the second spacing element is provided by one or more adhesive bumps.

4. An electronic component according to claim 3, wherein the adhesive bump comprises an electrically insulating adhesive.

5. An electronic component according to claim 2, wherein the first major surface comprises a first mating member and the second major surface comprises a second mating member which is adapted to mate with the first mating member, the first mating member and the second mating member providing a spacing element which spaces the first major surface at a distance from the second major surface.

6. An electronic component according to claim 5, wherein the third major surface comprises a third mating member and the fourth major surface comprises a fourth mating member which is adapted to mate with the third mating member, the third mating member and the fourth mating member providing a spacing element which spaces the third major surface at a distance from the fourth major surface.

7. An electronic component according to claim 5, wherein the first mating member comprises at least one protrusion and the second mating member comprises at least one depression.

8. An electronic component according to claim 6, wherein the third mating member comprises at least one protrusion and the fourth mating member comprises at least one depression.

9. An electronic component according to claim 1, wherein the vertical semiconductor device is one of diode and a transistor.

10. The electronic component of claim 1, wherein the first and second galvanically deposited metallic layers are each free of tin.

11. The electronic component of claim 1, wherein the first and second galvanically deposited metallic layers are each free of soft solder.

12. The electronic component of claim 1, wherein the first and second galvanically deposited metallic layers are each free of diffusion solder.

* * * * *